US007875907B2

(12) United States Patent
Honea et al.

(10) Patent No.: US 7,875,907 B2
(45) Date of Patent: Jan. 25, 2011

(54) III-NITRIDE BIDIRECTIONAL SWITCHES

(75) Inventors: James Honea, Santa Barbara, CA (US);
Primit Parikh, Goleta, CA (US); Yifeng Wu, Goleta, CA (US); Ilan Ben-Yaacov, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 312 days.

(21) Appl. No.: 12/209,581

(22) Filed: Sep. 12, 2008

(65) Prior Publication Data

US 2009/0065810 A1    Mar. 12, 2009

Related U.S. Application Data

(60) Provisional application No. 60/971,721, filed on Sep. 12, 2007.

(51) Int. Cl.
*H01L 29/66* (2006.01)

(52) U.S. Cl. .............................. 257/192; 257/E29.001

(58) Field of Classification Search ................. 257/192, 257/E29.001
See application file for complete search history.

(56) References Cited

U.S. PATENT DOCUMENTS

| 2005/0189561 | A1 | 9/2005 | Kinzer et al. | |
| 2005/0189562 | A1* | 9/2005 | Kinzer et al. | ............... 257/192 |
| 2006/0043499 | A1 | 3/2006 | De Cremoux et al. | |
| 2006/0060871 | A1* | 3/2006 | Beach | ........................ 257/94 |

FOREIGN PATENT DOCUMENTS

| JP | 2006-033723 A | 2/2006 |
| JP | 2007-036218 A | 2/2007 |

OTHER PUBLICATIONS

International Search Report and Written Opinion of the International Searching Authority, International Application Serial No. PCT/US2008/076160, Mar. 18, 2009, 11 pp.
Mishra et al., "Enhancement Mode III-N HEMTs", U.S. Appl. No. 12/108,449, filed Apr. 23, 2008, 58 pp.
Suh al., "Enhancement Mode Gallium Nitride Power Devices", U.S. Appl. No. 11/856,687, filed Sep. 17, 2007, 58 pp.

* cited by examiner

*Primary Examiner*—Lex Malsawma
(74) *Attorney, Agent, or Firm*—Fish & Richardson P.C.

(57) ABSTRACT

Bidirectional switches are described. The bidirectional switches include first and a second III-N based high electron mobility transistor. In some embodiments, the source of the first transistor is in electrical contact with a source of the second transistor. In some embodiments, the drain of the first transistor is in electrical contact with a drain of the second transistor. In some embodiments, the two transistors share a drift region and the switch is free of a drain contact between the two transistors. Matrix converters can be formed from the bidirectional switches.

36 Claims, 13 Drawing Sheets

| 12 kHz PWM | HEMT: 20 A | IGBT: 20A* |
|---|---|---|
| Gate Voltage Swing | 0 to <7V | 0-15V |
| Input Cap | 15-30 pf/A | 95pF/A |
| Igg Avg/Peak | <50-100 uA / 210-420 mA | 2.4mA / 3A |

(b)

III-NITRIDE BIDIRECTIONAL SWITCHES

CROSS REFERENCE TO RELATED APPLICATIONS

This application claims priority to U.S. Provisional Application Ser. No. 60/971,721, filed on Sep. 12, 2007, which is in incorporated herein for all purposes.

TECHNICAL FIELD

This invention relates to III-nitride semiconductor based power circuits and bidirectional switches.

BACKGROUND

AC-AC power converters are used in a wide range of applications, most commonly in motor drives. The topology of a standard converter, which converts AC to DC and then back to AC, consists of a rectifier 51, a pulse width modulation (PWM) inverter 52, and a DC filter capacitor 53, as shown in FIG. 1. In recent years, the increased attention on energy efficiency has spurred the development of matrix converters. The main circuit of a matrix converter, illustrated in FIG. 2, is composed of an input filter (not shown) and nine bidirectional switches 61, also known as bilateral switches. The matrix converter has a number of advantages over the standard converter. Matrix conversion directly converts AC to AC, thus eliminating the need for a large DC filter capacitor. The matrix converter is composed of a set of bidirectional switches, thus permitting both generation and motoring using the same set of switches. Further, the matrix converter permits an optimized power factor and harmonic content of input currents and three-level voltage switching for reduced voltage stress.

The bidirectional switches used in power converters such as matrix converters optimally have low loss, low on-resistance, fast switching times, and often must be able to withstand large voltages, typically 600-1200V. In some embodiments, the device that comprises the bidirectional switch is an enhancement-mode (normally off) device, which prevents damage to the device or other circuit components in case of circuit failure by preventing any accidental turn on of the device. The device predominantly used for bidirectional switching in power converters is the silicon insulated gate bipolar transistor (Si IGBT). While IGBT's are capable of handling the power requirements of the power converter circuits in which they are used, the devices themselves are neither bidirectional nor planar, i.e., current flows vertically and in only one direction in an IGBT. Thus, the device requires a relatively complicated configuration to operate properly. Several common configurations of IGBT-based bidirectional switches are shown in FIG. 3. The more commonly used configurations consist of two anti-parallel IGBT's each in series with a blocking diode (FIGS. 3*b* and 3*c*), thus requiring a minimum of four discrete devices. A simpler configuration consists of two anti-parallel reverse blocking IGBT's (FIG. 3*a*); however, these devices are more expensive due to the complexity of their design (FIG. 3*d*) and tend to experience higher loss.

SUMMARY

With the recent development of III-Nitride or III-N technology, III-Nitride semiconductor devices have emerged as an attractive candidate in high power applications for carrying large currents and supporting high voltages while providing very low on-resistance and fast switching times. III-N based high electron mobility transistors (HEMTs) are especially attractive for bidirectional switching because they can be formed as planar devices, thus greatly simplifying the integration of multiple devices into a bidirectional switch. Additionally, the superior properties of III-Nitride HEMTs over conventional devices used in bidirectional switches enables much more compact designs and allows for more flexibility and improved performance of adjacent circuit blocks, such as gate drive circuits. Bidirectional switches based wholly or partly on III-N HEMT technology are described, as well as matrix converter technology that is enabled by these bidirectional switch designs. Several device structures combined in various configurations to form bidirectional switches are described as embodiments. A number of variations within each embodiment are listed as well.

In one aspect, bidirectional switches based on III-N HEMT technology for high power applications are described. The switches have improved performance, e.g., lower loss, smaller size system, and fewer components over conventional devices and allow for very compact designs of high power circuits.

In another aspect, III-N HEMT based bidirectional switches are incorporated into designs for matrix converters which take advantage of the benefits offered by these switches.

In yet another aspect, associated components in a matrix converter are simplified due to the properties of III-N based bidirectional switches. In embodiments, the very small gate drive current required for III-N devices enables a simpler gate drive circuit and potential integration of the gate drive circuit with the power switch.

In one aspect, a bidirectional switch is described. The switch has a first III-N based high electron mobility transistor and a second III-N based high electron mobility transistor. The first III-N based high electron mobility transistor includes a first gate and a first drain and the second high electron mobility transistor includes a second gate and a second drain. The first drain and the second drain are not in electrical contact with one another when the first gate and the second gate are biased relative to their respective source low or off. Either a first source of the first III-N based high electron mobility transistor is in electrical contact with a second source of the second III-N based high electron mobility transistor or the first III-N based high electron mobility transistor shares a common source with the second III-N based high electron mobility transistor.

In another aspect, a bidirectional switch is described. The switch includes a first III-N based high electron mobility transistor and a second III-N based high electron mobility transistor. The first III-N based high electron mobility transistor includes a first gate and a first source and the second high electron mobility transistor includes a second gate and a second source. The first source and the second source are not in electrical contact with one another when the first gate and the second gate are biased relative to their respective source low or off. Either the first drain of the first III-N based high electron mobility transistor is in electrical contact with the second drain of the second III-N based high electron mobility transistor or the first III-N based high electron mobility transistor shares a common drain with the second III-N based high electron mobility transistor.

In yet another aspect, a bidirectional switch is described. The switch includes a first III-N based high electron mobility transistor and a second III-N based high electron mobility transistor. The first III-N based high electron mobility transistor shares a drift region with the second III-N based high electron mobility transistor and the switch is free of a drain contact in between the first III-N based high electron mobility transistor and the second III-N based high electron mobility transistor. A length of the drift region is equal to or greater than a sum of a maximum voltage difference between a first source terminal of the first III-N based high electron mobility transistor and the second source terminal of the second III-N based high electron mobility transistor and a difference between high and low voltage signals applied to the first gate with respect to the first source and the second gate with respect to the second, the sum divided by an effective critical field in material of the drift region.

In another aspect, a bidirectional switch is described. The switch includes a first enhancement mode transistor, a second enhancement mode transistor, a first depletion mode III-N high electron mobility transistor and a second depletion mode III-N high electron mobility transistor. The first depletion mode III-N high electron mobility transistor is between the first enhancement mode transistor and the second enhancement mode transistor. The second depletion mode III-N high electron mobility transistor between the first depletion mode high electron mobility transistor and the second enhancement mode transistor. A gate of first depletion mode III-N high electron mobility transistor is electrically connected to a source of the first enhancement mode transistor. A gate of second depletion mode III-N high electron mobility transistor is electrically connected to source of second enhancement mode transistor. A source of first depletion mode III-N high electron mobility transistor is electrically connected to a drain of the first enhancement mode transistor. A source of the second depletion mode III-N high electron mobility transistor is electrically connected to drain of the second enhancement mode transistor. The source of the first depletion mode III-N high electron mobility transistor and the source of the second depletion mode III-N high electron mobility transistor are not in electrical contact with one another when the gates of the first depletion mode III-N high electron mobility transistor and second depletion mode III-N high electron mobility transistor are biased relative to their respective source low or off. Either the first depletion mode III-N high electron mobility transistor shares a drain with the second depletion mode III-N high electron mobility transistor, a drain of the first depletion mode III-N high electron mobility transistor is electrically connected to a drain of the second depletion mode high electron mobility transistor, or the first depletion mode III-N high electron mobility transistor shares a drift region with the second depletion mode III-N high electron mobility transistor and the switch is free of a drain contact in between the first depletion mode III-N high electron mobility transistor, the second depletion mode III-N high electron mobility transistor and a length of the drift region is equal to or greater than a maximum voltage difference between a source terminal of the first enhancement mode III-N high electron mobility transistor and a source terminal of the second enhancement mode III-N high electron mobility transistor, divided by an effective critical field in material of the drift region.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 4:
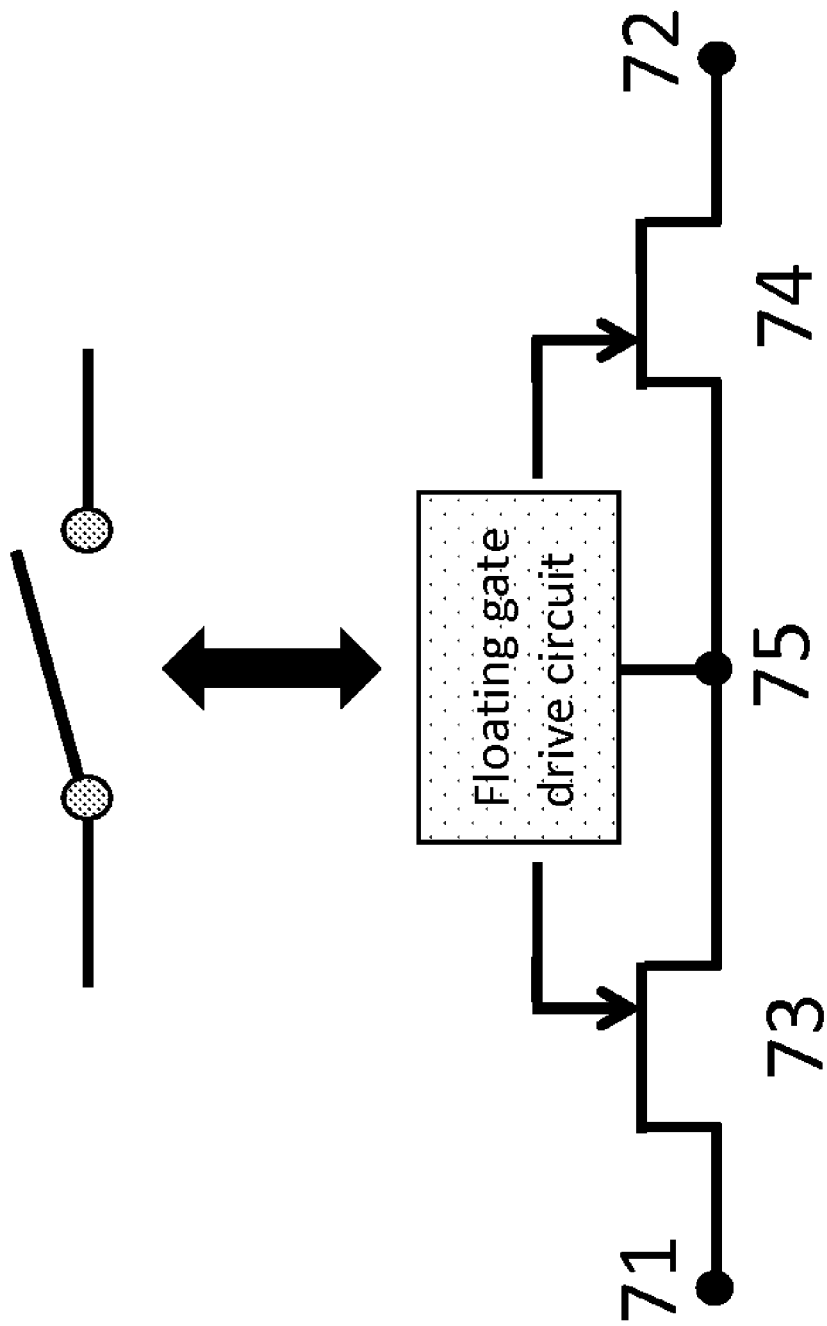
FIG. 4 shows a circuit diagram for a bidirectional switch.

Referring to FIG. 4, in some embodiments a III-N HEMT-based bidirectional switch consists of two HEMT devices. The gates of each of the two HEMTs are connected to a floating gate drive circuit, which is configured to apply individual voltage signals to each of the two gates. In this configuration, the sources of both devices are connected, and the gate drive circuit applies signals relative to the common source of the two devices. When the voltage at node 71, i.e., at the drain of HEMT device 73, is higher than that at node 72, i.e., at the drain of HEMT device 74, only device 73 is capable of being turned off. Thus, when the gate of device 73 is biased low, or when the gates of both HEMTs are biased low, almost all of the voltage is blocked by device 73, and the switch is in the OFF state. When the gate of device 73 is biased high, both devices allow current to pass; thus the switch is in the ON state. Biasing the gate of device 74 high when the switch is in the ON state reduces the voltage drop across that device.

When the polarity of the voltage across the switch is reversed so that the voltage on the right side, i.e. at node 72, is higher than that on the left, i.e. at node 71, the entire function is reversed. When the voltage at node 72 is higher than the voltage at node 71, only HEMT device 74 is capable of being turned off. Thus, when the switch is in the OFF state, i.e., the gate of device 74 is biased low or both gates are biased low, almost all of the voltage is blocked by the device on the right, and when the switch is in the ON state, current passes through both devices.

Although the switch in FIG. 4 is typically formed with enhancement mode (normally off) devices when used in power switching applications, depletion mode (normally on) devices also can be used with the switch shown in FIG. 4 as long as the gate drive circuit provides appropriate signals for depletion mode devices (i.e., the low voltage must be sufficiently negative). However, for some circuit applications, it is desirable that the two HEMTs be enhancement mode (E-mode) devices, and for some circuit applications depletion mode devices are acceptable. Additionally, in applications where enhancement mode devices are used, it can be desirable to use a device with a high barrier from source to drain in the OFF state in order to insure low levels of source-to-drain leakage.

Standard III-N HEMTs, which are fabricated on Ga-polar material, are typically normally on, and therefore conduct current at 0 gate voltage. While it is possible to make standard III-N devices with a threshold voltage greater than 0, it can be difficult to simultaneously ensure a high barrier from source to drain in the OFF state. Thus, some conventional devices used in high voltage applications exhibit a large amount of source to drain leakage in the OFF state. More suitable enhancement mode III-N devices for high power applications, such as the power converters described here, are structures fabricated on N-polar material, such as those described in U.S. Ser. No. 11/856,687, filed Sep. 17, 2007, or of the Ga-face structures described in U.S. Ser. No. 12/108,449, filed Apr. 23, 2008, both of which are incorporated herein by reference for all purposes.

Figure 5:
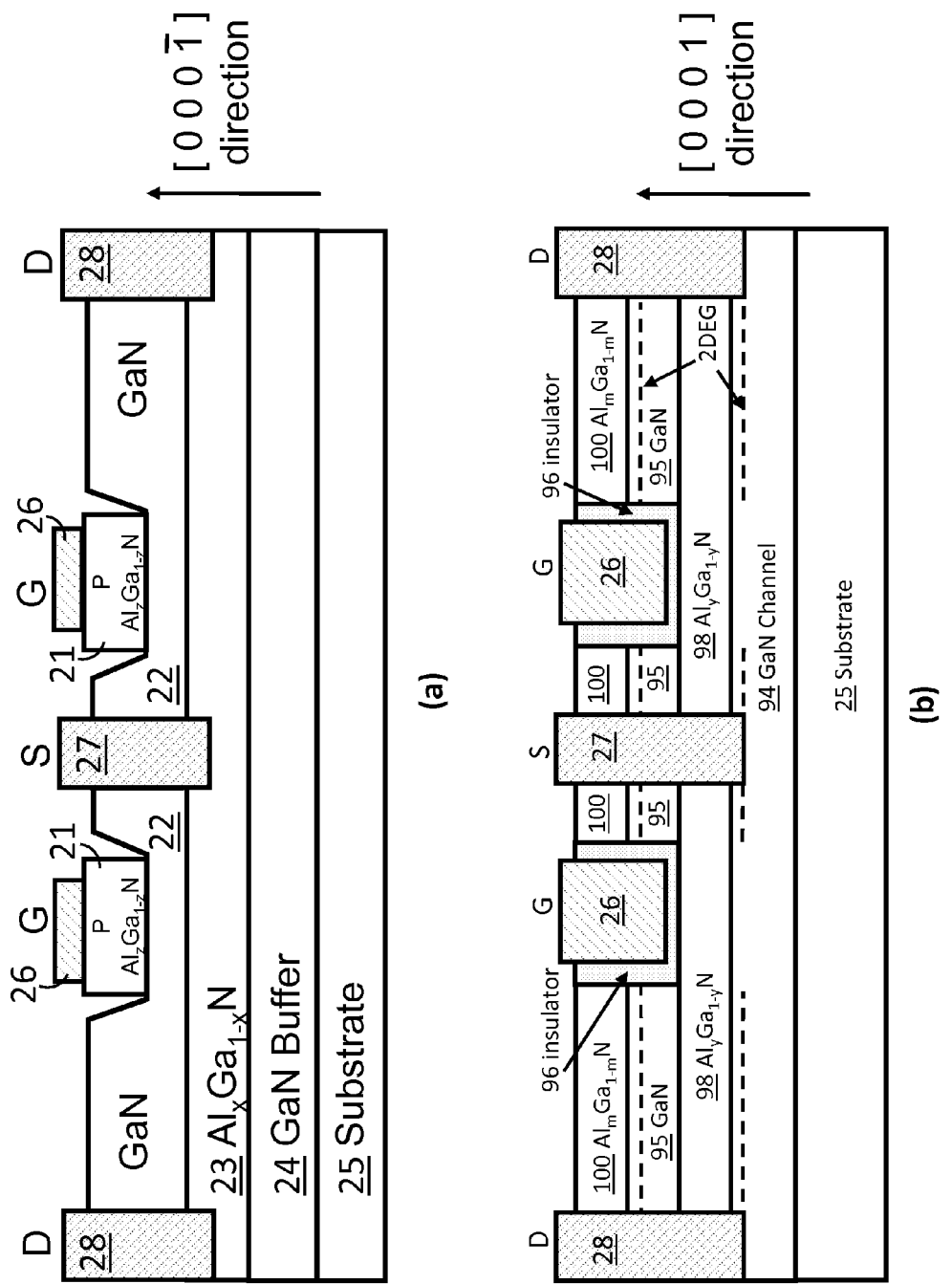
FIG. 5 shows cross-sectional views of a bidirectional switch using III-N HEMT technology.

The switch in FIG. 4 can be implemented using two discrete III-N HEMTs, wherein the sources of the two HEMTs are externally connected. Alternatively, the HEMTs which make up the switch may be integrated on a single chip, as illustrated in FIG. 5. Referring to FIG. 5a, a cross-sectional schematic view of the switch in FIG. 4 illustrates an E-Mode N-polar embodiment of how the switch is implemented using III-N HEMT technology. In this embodiment, N-polar enhancement mode HEMT structures are used to achieve high source to drain barriers when the HEMTs are in the OFF state, although in general any structure that results in an enhancement mode or depletion mode III-N HEMT could be used. The E-mode HEMTs are formed on a substrate 25, with a GaN buffer 24 on the substrate 25. Two layers on the GaN buffer 24 form a two-dimensional electron gas (2DEG) through which current can be conducted, a layer of $Al_xGa_{1-x}N$ 23 and a layer of GaN 22. The 2DEG is formed in GaN layer 22 near the interface between GaN 22 and $Al_xGa_{1-x}N$ 23. Source 27 and drain 28 ohmic contacts are made to the 2DEG The HEMTs are formed as mirror images of one another so that the sources are adjacent to one another or are formed as a single component. The channel layer of GaN 22 includes a recess in which a p type cap 21 of $Al_zGa_{1-z}N$ is located. A gate electrode 26 is formed on the p type cap 21.

FIG. 5b shows a cross-sectional view of the switch in FIG. 4, illustrating how the bidirectional switch is implemented using III-polar E-mode III-N HEMT technology. The HEMT devices are formed on a substrate 25, with a GaN channel layer 94 on the substrate 25 and an $Al_yGa_{1-y}N$ layer 98 atop GaN channel layer 94. The HEMT access regions also include a GaN layer 95 atop $Al_yGa_{1-y}N$ layer 98, and an $Al_mGa_{1-m}N$ layer 100 atop GaN layer 95. In the gate region, the gate electrodes 26 lie directly on top of $Al_yGa_{1-y}N$ layer 98 in between layers 95 and 100. A gate insulator 96 may optionally separate gate electrodes 26 from III-N layers 98, 95, and 100, as shown.

In the HEMTs shown in FIG. 5b, the Al compositions of layers 98 and 100 are adjusted such that a 2DEG region shown by the dotted line is present in the access regions in layers 95 and 94, but not underneath the gates 26, in the absence of an applied gate voltage. When either of the gate electrodes 26 are biased high relative to the source, a conducting 2DEG channel is formed beneath the gate in layer 94, adjacent the interface between layers 94 and 98. Further, a vertical conducting region is formed in layer 95 adjacent the sidewall of insulator 96, resulting from the accumulation of charge from the positive control voltage on the gate 26. In addition, a path via the mechanisms of tunneling through the barrier or emission over the barrier, or both, is formed through layer 98. This path connects the 2DEG channel access regions in layer 95 to the conducting 2DEG channel in layer 94, completing the conduction path from source 27 to drain 28. Thus, when a HEMT device is ON, the conducting channel from source 27 to drain 28 comprises the 2DEG channel in layer 94 underneath the gate, along with the 2DEG channel access regions in layers 94 and 95, which are connected by the vertical conducting regions in layers 95 and 98.

By way of example, the embodiment of the invention shown in FIG. 5b can be achieved with the following parameters for layers 98, 95, and 100: layer 98 is a 3 nm thick $Al_yGa_{1-y}N$ layer with y=0.23; layer 95 is a 3 nm thick GaN layer; and layer 100 is a 15 nm thick $Al_mGa_{1-m}N$ layer with m=0.23. In this example, a 2DEG region is expected to be present in the access regions in layers 95 and 94, shown by the dotted lines, and the 2DEG sheet charge density in layer 94 is approximately two times that in layer 95.

Alternatively, the HEMTs which make up the switch in FIG. 5b can be designed such that no significant 2DEG is present in the access regions in layer 94. For example, this can be achieved by reducing the Al composition y in layer 98. The detailed operating principles of the HEMT structure shown here are described in U.S. Ser. No. 12/108,449, filed Apr. 23, 2008.

Figure 6:
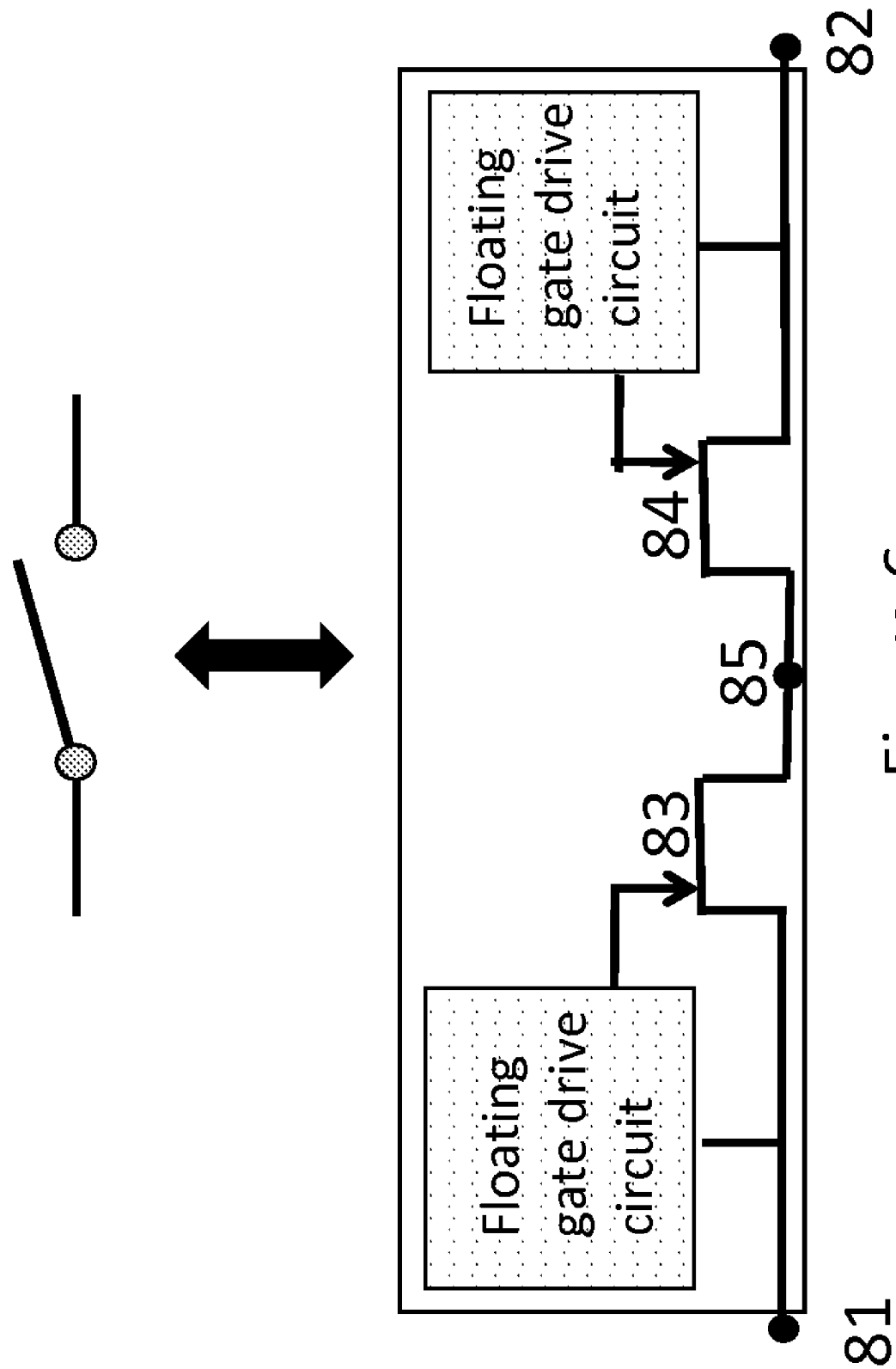
FIG. 6 shows a circuit diagram for a bidirectional switch.

Referring to FIG. 6, in some embodiments, a bidirectional switch includes two III-N HEMTs connected in series, but sharing a common drain. The signal on the gates of each HEMT is applied relative to that device's source. When the voltage at node 81, i.e., at the source of HEMT device 83, is higher than that at node 82, i.e., at the source of HEMT device 84, only device 84 is capable of being turned off. Thus, when the gate of device 84 is biased low, or when the gates of both HEMTs are biased low, almost all of the voltage is blocked by device 84, and the switch is in the OFF state. When the gate of device 84 is biased high, both devices allow current to pass, and the switch is in the ON state. Biasing the gate of device 83 high when the switch is in the ON state reduces the voltage drop across that device. Again, the situation is reversed when the polarity of the voltage across the switch is reversed so that the voltage at node 82 is higher than that at node 81. When the polarity of the voltage across the switch is reversed, only device 83 is capable of being turned off. Thus, when the switch is in the OFF state (gate of 83 biased low), almost all of the voltage is blocked by device 83, and when the switch is in the ON state, current passes through both devices. Appropriate gate drive circuits provide the required control signals.

Figure 7:
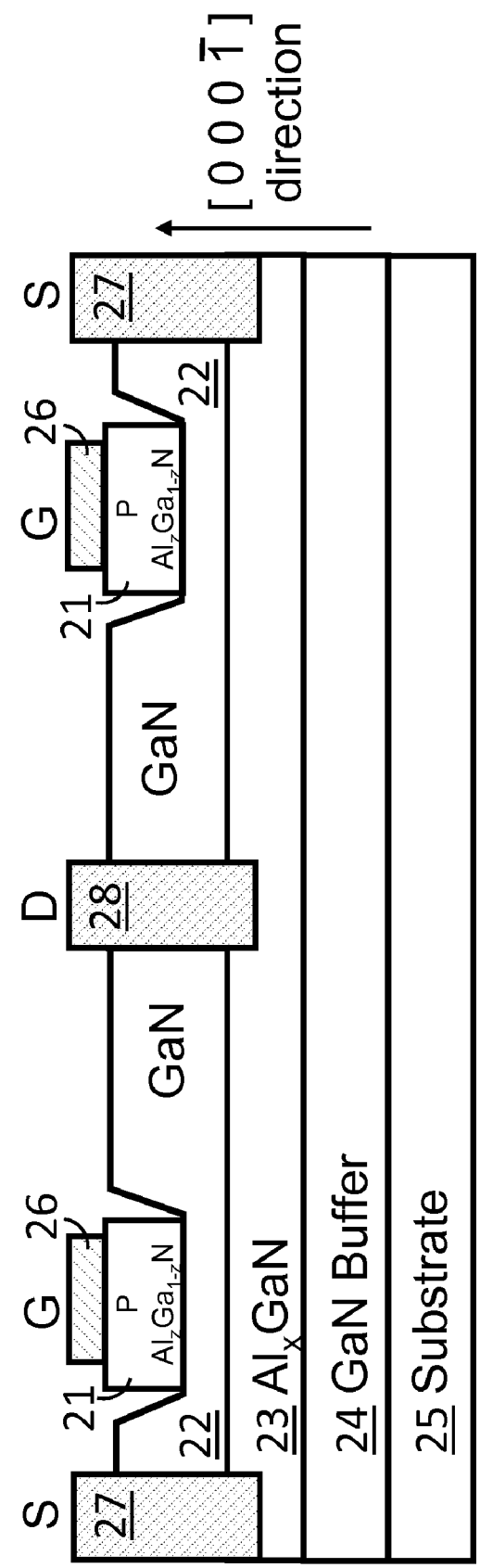
FIG. 7 shows a cross-sectional schematic view of a bidirectional switch using III-N HEMT technology.

Referring to FIG. 7, a cross-sectional view illustrates the embodiment of FIG. 6 of an E-Mode N-polar III-N HEMT. Again, N-polar enhancement mode HEMTs are used to achieve a high source to drain barrier in the OFF state, although in general any structure that results in enhancement mode or depletion mode III-N HEMTs could be used. For example, the III-polar E-mode devices shown in FIG. 5b could also be arranged in the configuration illustrated by the circuit diagram in FIG. 6. The device is formed on a substrate 25, with a GaN buffer 24 on the substrate 25. Two layers on the GaN buffer 24 form a 2DEG through which current can be conducted, a layer of $Al_xGa_{1-x}N$ 23 and a channel layer of GaN 22. The 2DEG is formed in GaN layer 22 near the interface between GaN 22 and $Al_xGa_{1-x}N$ 23. Source 27 and drain 28 ohmic contacts are made to the 2DEG, with the devices formed as mirror images of one another so that the drains 28 are adjacent to one another or are formed as a single component. The channel layer of GaN 22 includes a recess in which a p type cap 21 of $Al_zGa_{1-z}N$ is located. A gate electrode 26 is formed on the p type cap 21.

Figure 1:
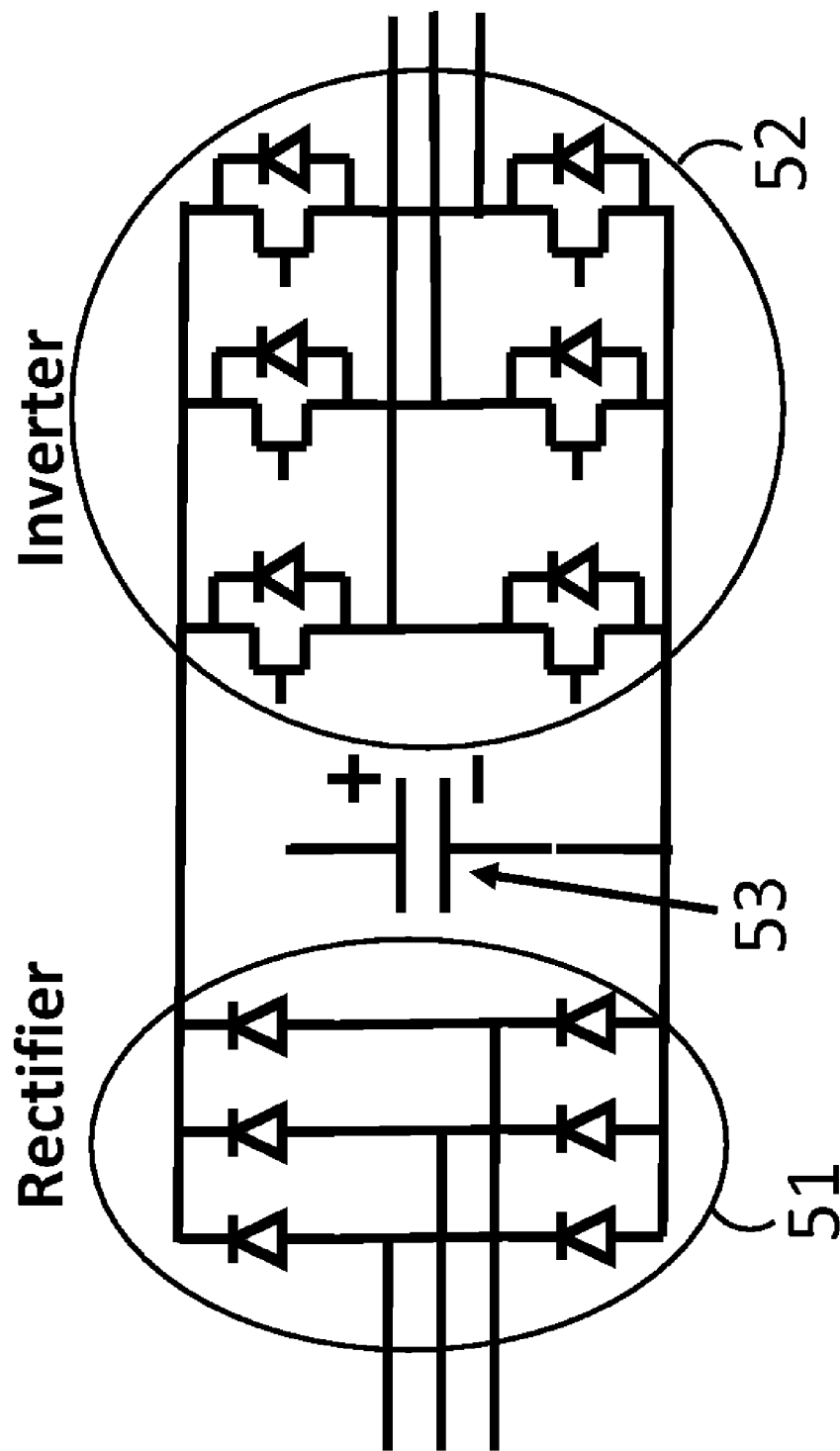
FIG. 1 is a schematic layout of a standard AC-AC power converter consisting of a rectifier, an inverter and a DC filter capacitor.
Figure 2:
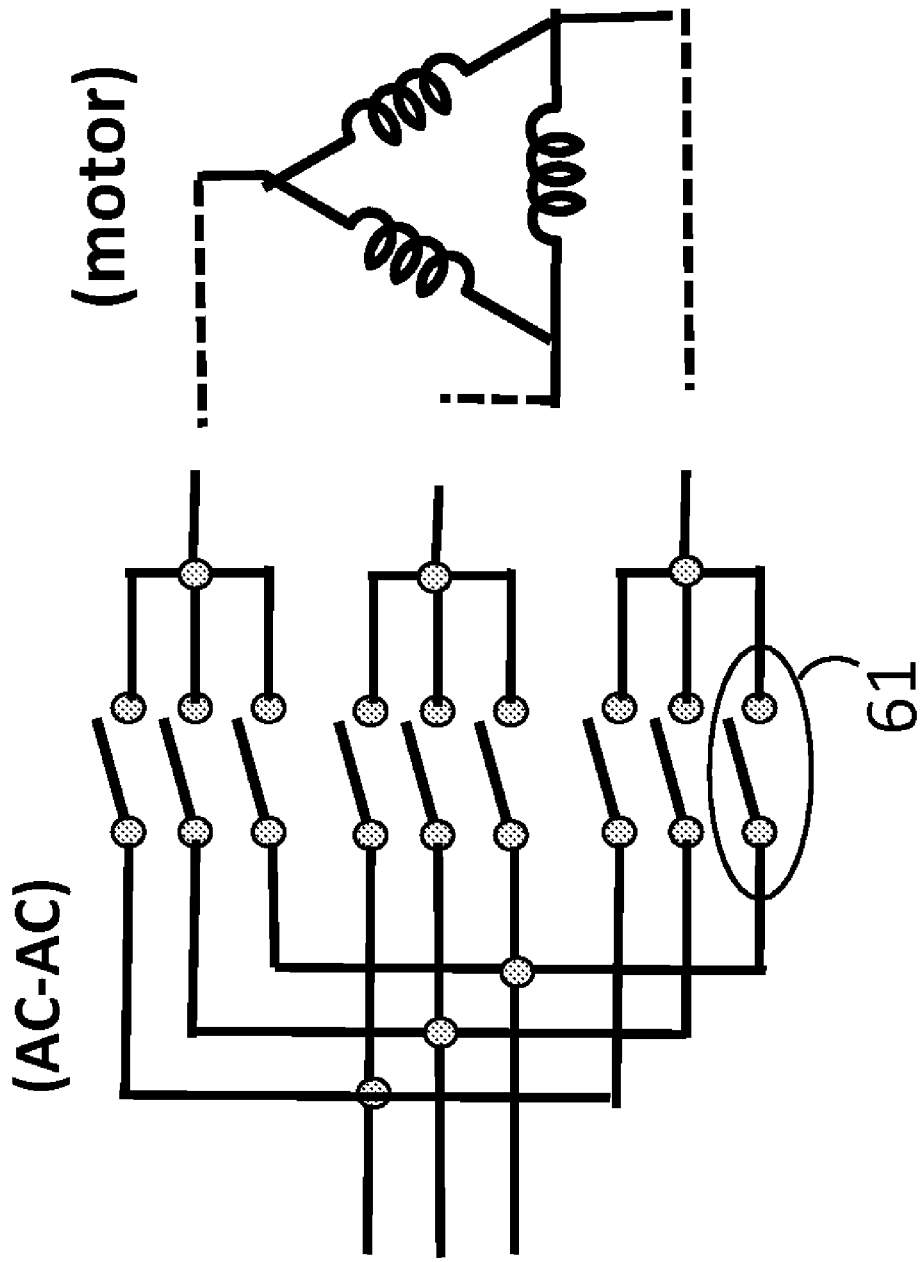
FIG. 2 is a main circuit of a matrix converter, illustrating the configuration of nine bidirectional switches.
Figure 3:
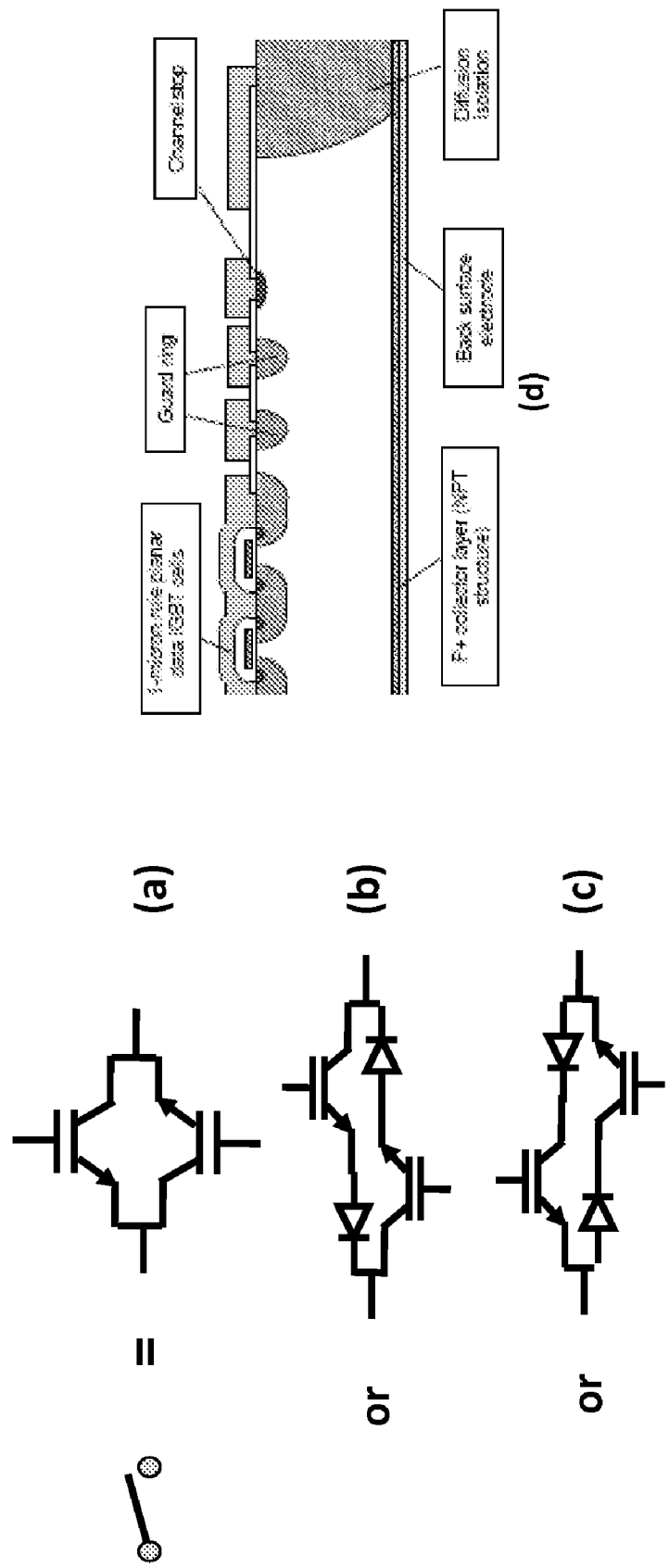
FIG. 3 shows schematic layouts of standard IGBT-based bidirectional switches and a cross-sectional view of a reverse-blocking IGBT. Subportion (a) shows a simple configuration which incorporates two reverse blocking IGBTs. Subportions (b) and (c) show switches composed of two standard IGBT's and two blocking diodes. Subportion (d) is the cross-sectional schematic view of a reverse-blocking IGBT of subportion (a).

In some applications in which bidirectional switches are used, for example the matrix converter shown in FIG. 2, two or more switches lead from their respective AC voltage supplies to a common node, which is connected to an inductive motor coil. A detailed diagram of this situation is shown in FIG. 8*a*, where all of the bidirectional switches are comprised of combinations of III-N enhancement-mode HEMTs described in previous embodiments. In the example shown in FIG. 8*a*, motor current 110 flows into the coil 114 in from switch 111 and out through switch 113 on the opposite side of the coil 114. The gates of both devices 127, 128 that make up switch 111 are biased high, as are the gates of both devices of switch 113, so both switches 111 and 113 are ON. Therefore, the voltage at node 118 is approximately the same as that of node 116, and the voltage at node 119 is approximately the same as that of node 117. The gates of both devices 125, 126 of switch 112 are biased low, such that switch 112 is OFF, in order to prevent any current from flowing through switch 112, or equivalently to prevent any coupling of the voltages at nodes 115 and 118.

During circuit operation, it may be necessary to switch the voltage at node 118 so that it is coupled to the voltage at node 115 and simultaneously decoupled from the voltage at node 116, i.e., the voltage at node 118 is switched from a value nearly equal to that at node 116 to a value nearly equal to that at node 115. The voltages at nodes 115, 116, and 117 all vary with time, as indicated in FIG. 8*b*. In FIG. 8*b*, the horizontal axis corresponds to time, the vertical axis corresponds to voltage, and the three lines 121, 122, and 123 indicate the voltages at nodes 115, 116, and 117, respectively. The switching sequence for the gates of devices 125-128 required to properly switch the voltage at node 118 depends on the relative voltages at nodes 115-117 at the time of switching.

The switching sequence beginning at the time indicated by vertical line 130 in FIG. 8*b* is illustrated in FIG. 8*c*. At the time indicated by line 130, the voltage at node 115 (200 V) is greater than that at node 116 (84 V), and the voltages at both these nodes are greater than that at node 117 (−333 V). The switching sequence, illustrated in FIG. 8*c*, is as follows. First (step 1), gate 127 is switched low. This results in a small voltage drop across device 127, so the voltage at node 118 drops slightly, as indicated in the bottom curve $V_{118}$ of FIG. 8*c*. Second (step 2), gate 126 is switched high, which turns switch 112 ON and 111 OFF and causes the current 110 to flow through switch 112 and not through switch 111. As indicated in the bottom curve $V_{118}$ of FIG. 8*c*, the voltage at node 118 is now slightly lower that at node 115, since device 125 is still biased low and therefore has a small voltage drop across it. Third (step 3), gate 128 is switched low to ensure that switch 111 remains OFF. Finally (step 4), gate 125 is switched high, thereby ensuring that switch 112 remains ON.

Figure 9:
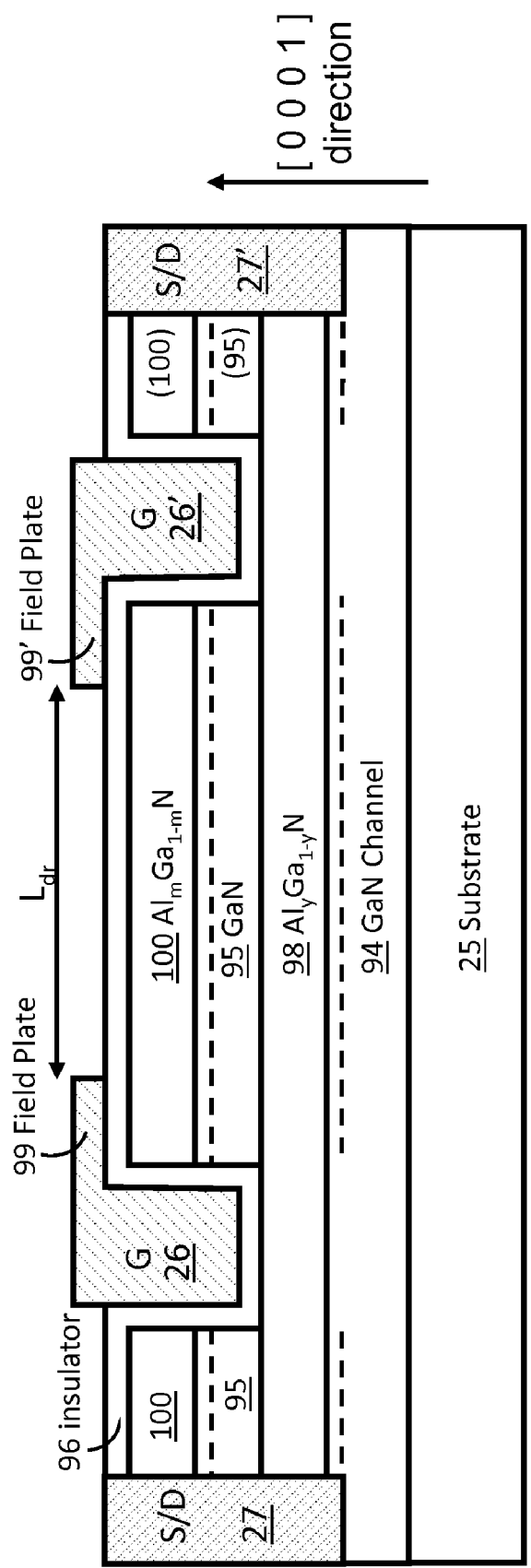
FIG. 9 shows a cross-sectional schematic view of a bidirectional switch using III-N HEMT technology.

Referring to FIG. 9, a cross section of a switch without a drain contact is shown. The material structure here is similar to that of the device in FIG. 5*b*. Furthermore, this device includes field plates 99/99' on both of the gates, which may be necessary to block sufficient voltage when the switch is in the OFF state. The field plates need only extend towards the opposite gate, as shown. In the bidirectional switch illustrated schematically in FIG. 6, the common drain shared by the two transistors is left floating, i.e., no voltage signals are ever applied between the common drain and any other nodes. It is therefore extraneous to include a metal drain pad, such as drain 28 in FIG. 7. The common drain region may therefore be designed without a contact pad. This design results in a compact structure containing contacts 27/27', which act as sources and drains depending on the polarity across the switch, as well as gate electrodes 26/26'. However, to ensure that the switch is capable of blocking the required voltage for the application in which it is used, the separation between the 2 field plates ($L_{dr}$ in FIG. 9), i.e., the length of the high field drift region, cannot be too small. The distance is specified by the formula $L_{dr} \geq (V_{bias}+V_{high-low})/E_{eff}$, where $V_{bias}$ is the maximum voltage difference between the two source terminals (i.e., across the entire switch) during operation, $V_{high-low}$ is the difference between the high and low voltage signals applied to the gates, and $E_{eff}$ is the effective critical field in the material in the drift region. The exact value of $E_{eff}$ depends on factors such as the specific designs of the field plate and other features of the device, as well as on the quality of the III-N materials and gate insulator material. Typical values for $E_{eff}$ for III-N technology are about 60 V/micron, about 100 V/micron, or about 200 V/micron. In the formula for $L_{dr}$, ($V_{bias}+V_{high-low}$) is the maximum voltage difference between the two gates of each switch that may be incurred during operation of the circuit while the switch is in the OFF state. Increasing $L_{dr}$ also increases the switch on-resistance, so $L_{dr}$ cannot be made too large. The maximum length of the high field drift region is about $2*L_{dr,min}$, where $L_{dr,min}=(V_{bias}+V_{high-low})/E_{eff}$ is the minimum length for $L_{dr}$ specified above.

The length of the high field drift region $L_{dr}$ depends on the required blocking voltage $V_{bias}$ for the specific circuit application. The larger the required blocking voltage, the longer the drift region needs to be. A typical drift region length for a 1200V device is about 20 microns. In some embodiments, the switches are designed so that the high signal $V_{high}$ is the same for both gates and the low signal $V_{low}$ is the same for both gates.

Figure 8:
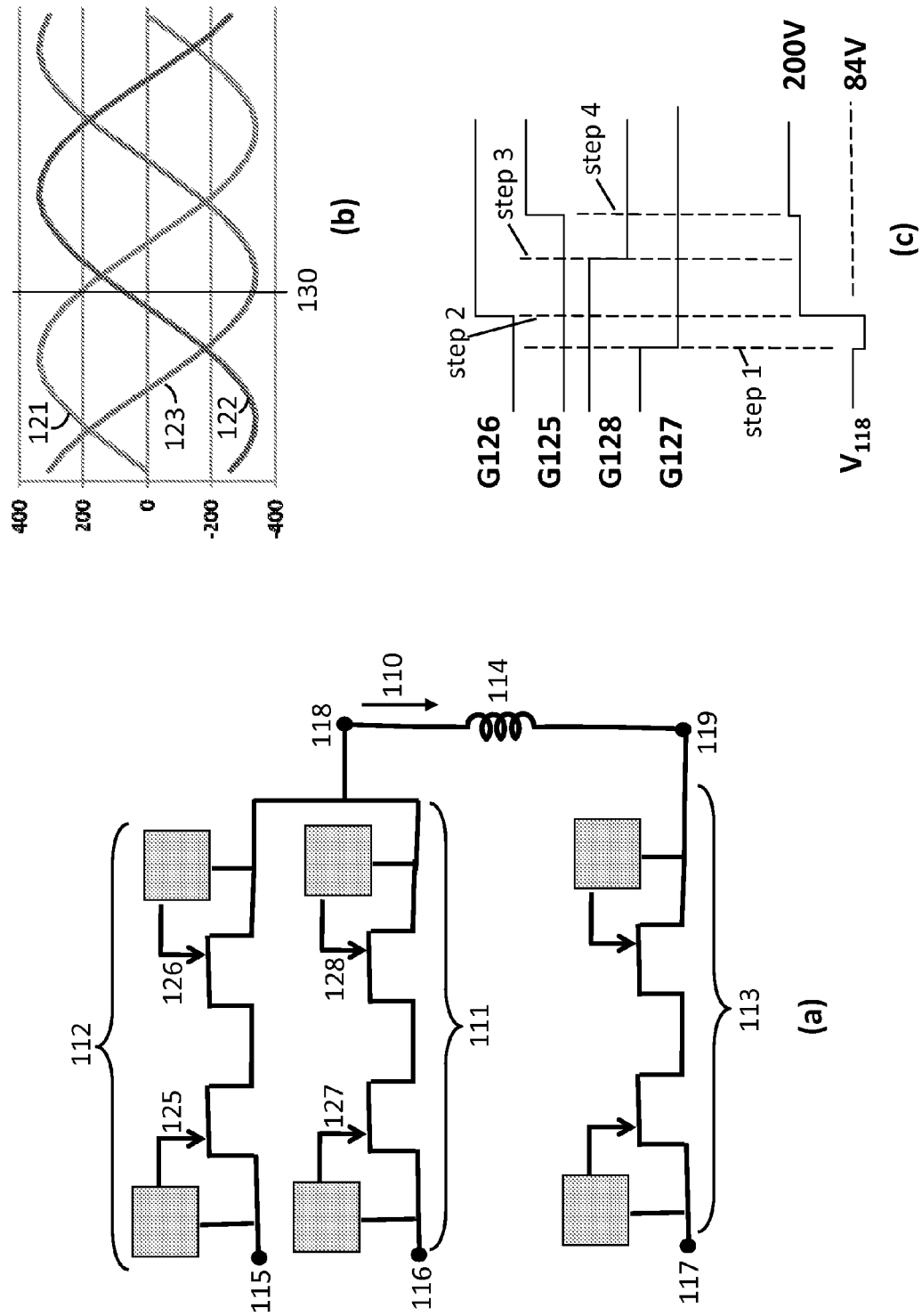
FIG. 8, subportion (a), shows a circuit diagram for a portion of a matrix converter comprised of III-N bidirectional switches. Subportion (b) shows the voltages at 3 of the nodes of subportion (a). Subportion (c) shows the timing sequence for switching two of the bidirectional switches in subportion (a).

In the switching cycle described in FIG. 8, the voltage difference between gates 127 and 128 is $V_{bias}+V_{high-low}$ during the time between steps 2 and 3 if switching occurs right when the voltage difference between nodes 115 and 116 is equal to $V_{bias}$. During this time, the voltage at node 118 $V_{118}$ is about the same as that at node 115 $V_{115}$, so $V_{118}-V_{116}=V_{115}-V_{116}=V_{bias}$, and $(V_{128}-V_{118})-(V_{127}-V_{116})=V_{high-low}$. Solving for $(V_{128}-V_{127})$ gives $V_{128}-V_{127}=V_{high-low}+(V_{118}-V_{116})=(V_{bias}+V_{high-low})$. In a standard unidirectional E-mode field-effect transistor (FET), such as an E-mode HEMT, the maximum voltage across the high-field drift region never exceeds $V_{bias}$. While $V_{bias}$ is typically much larger than $V_{high-low}$ in high-voltage applications, in low-voltage applications the two values may be much closer. For example, $V_{high-low}$ may be about 10% or about 20% the value of $V_{bias}$. In embodiments, the footprint, as shown below in FIG. 10, which includes the regions of the switch contained within the dashed rectangles, is smaller than other two-transistor switches and only somewhat bigger than a single transistor, such as less than 50%, less than 25% or less than 15% bigger. Furthermore, because the length of the shared blocking region is smaller, when the device is on, this embodiment exhibits roughly half the loss of other embodiments.

Figure 10:
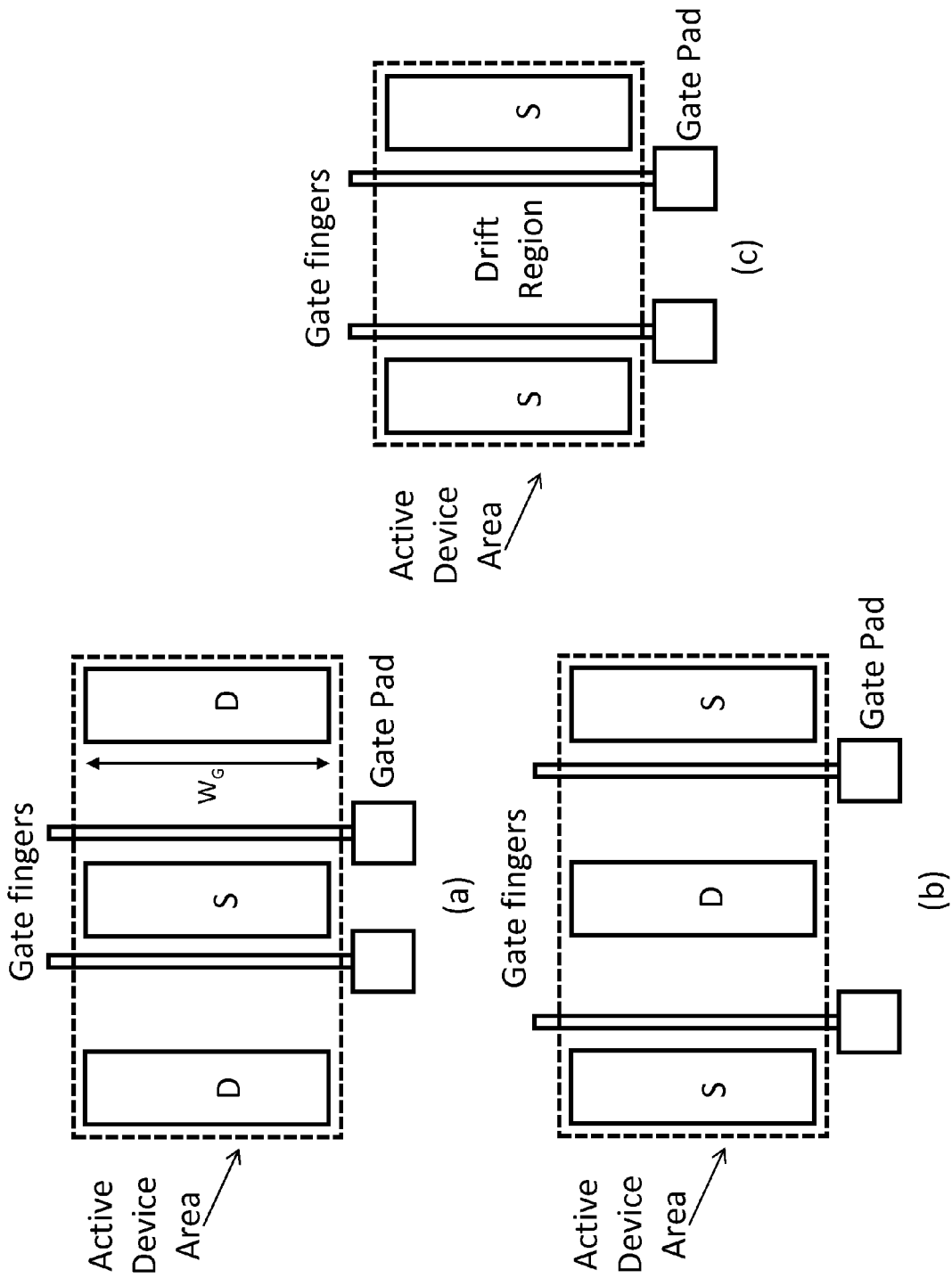
FIG. 10 shows schematic plan views of three switches, according to the switches in FIGS. 5, 7 and 9, respectively.

Referring to FIG. 10, plan views of the devices described herein are shown. Referring to FIGS. 10*a* and 10*b*, plan views of the embodiments shown in FIGS. 5 and 7, respectively show two gate fingers each connected to a gate pad, where each gate finger is between a source and a drain. FIG. 10*c*, which corresponds to FIG. 9, shows two gate fingers adjacent each to a source. Between the two gate fingers is a drain region. A separate drain contact is not required.

Figure 11:
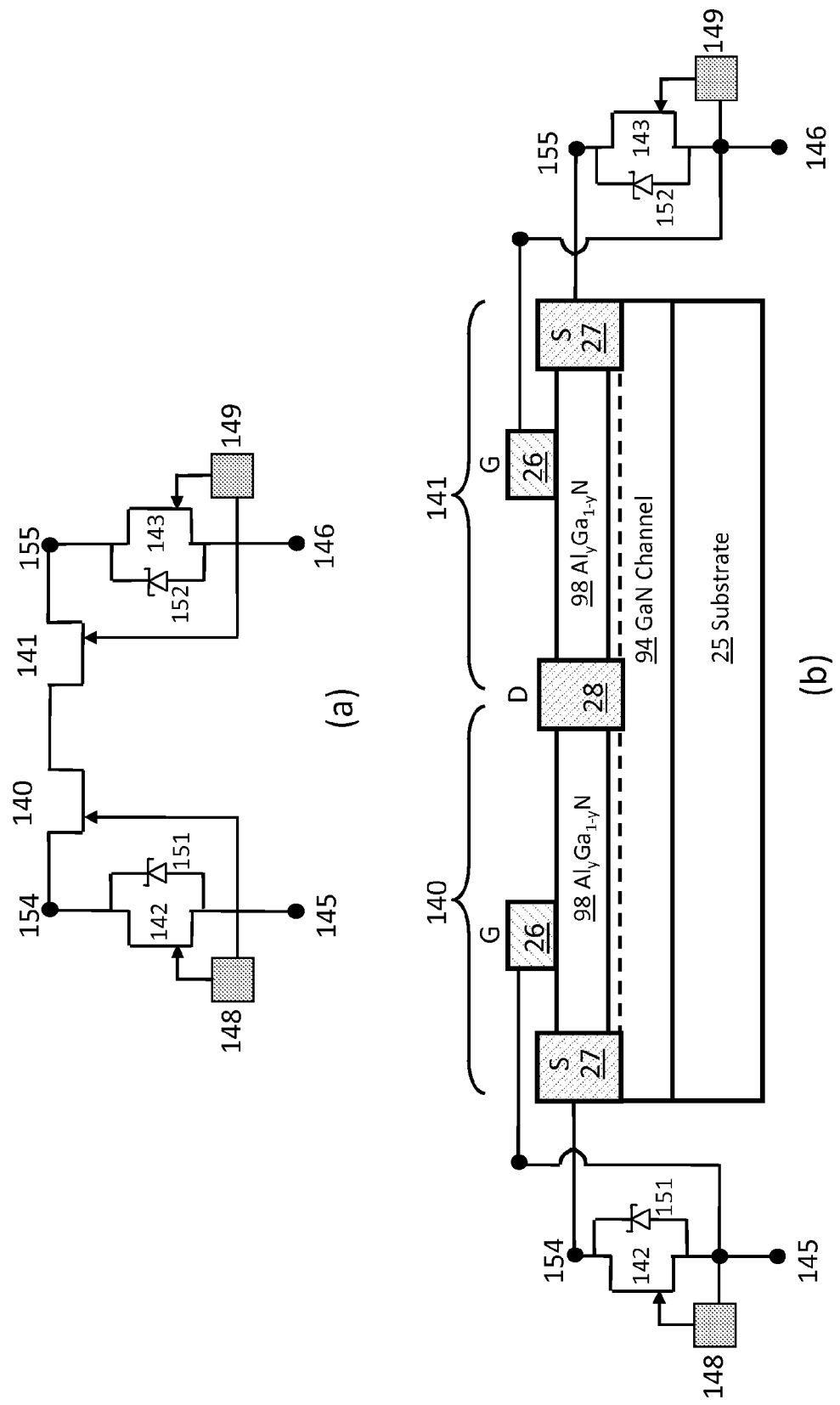
FIG. 11 shows a circuit diagram and cross-sectional schematic views of a bidirectional switch using III-N HEMT technology in combination with lower voltage components.
Figure 11:
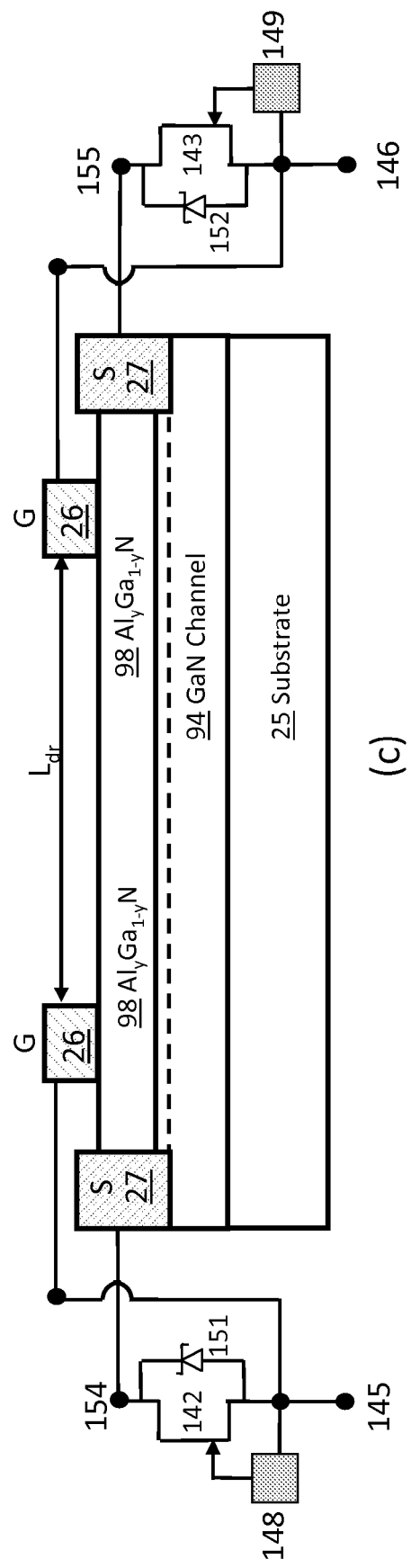

While the designs illustrated in FIGS. 6, 7, and 9 can be realized using enhancement mode or depletion mode III-N HEMTs, enhancement mode devices are preferable in order to prevent accidental turn-on of the device. However, E-mode devices are much more difficult to achieve using III-N technology than D-mode devices, especially for high-voltage applications. FIG. 11 shows a bidirectional switch for which off-state blocking is carried out by III-N D-mode devices, but the switch functions similarly to that of the E-mode implementation of FIG. 7, i.e., the switch is OFF when 0V control voltage is applied and ON when a sufficiently positive control voltage is applied.

As seen in the circuit schematic shown in FIG. 11a, the design includes two high-voltage D-mode devices 140 and 141, such as III-N HEMTs, connected in the same configuration as the devices in FIG. 6, i.e., in series with a common drain, along with 2 additional low-voltage E-mode devices 142 and 143, such as Si FETs or low-voltage III-N HEMTs. The D-mode devices each are capable of blocking the maximum voltage drop across the switch, which for high-voltage applications can be 600V or 1200V or other suitable blocking voltage required by the application. The D-mode device threshold voltages for III-N HEMTs are typically about −5 to −10V (D-mode=negative $V_{th}$). E-mode devices block at least $|V_{th}|$, where $|V_{th}|$ is the magnitude of the threshold voltage of the D-mode devices (in some embodiments the E-mode devices block about $2*|V_{th}|$). In a typical case, D-mode device can block 1200V and has a threshold voltage of about −5V, the E-mode device blocks at least 5V, such as at least 10V. The two D-mode devices share a common drain and may be designed similar to the structures in FIGS. 7 and 9 except with D-mode III-N HEMTs, as seen in the schematic in FIG. 11b.

Alternatively, the two D-mode devices can share a drain region that is free from a metal drain pad, as shown in FIG. 11c. For the switch shown in FIG. 11c, because the gate 26 of each of the two D-mode devices is in electrical contact with the source of the corresponding E-mode device, the maximum voltage difference between the two gates during operation of the switch is $V_{bias}$, where $V_{bias}$ is the maximum voltage difference between nodes 145 and 146 (i.e., across the entire switch). The length of the high field drift region cannot be too small and is specified by the formula $L_{dr} > V_{bias}/E_{eff}$, where $E_{eff}$ is defined as before.

E-mode devices 142 and 143 are capable of blocking a voltage larger than the magnitude of the threshold voltage of devices 140 and 141, respectively, such as about twice the threshold voltage of these devices. Because the typical threshold voltage for high voltage D-mode III-N devices is about −5 to −10 V, devices 142 and 143 can be able to block about 10-20 V. As shown, the gates of devices 140 and 141 are connected to the sources of devices 142 and 143, respectively. Nodes 145 and 146 are the inputs/outputs of the switch. The control voltages are applied at terminals 148 and 149 between the source and gate of devices 142 and 143, respectively. When Si FETs are used for devices 142 and 143, diodes 151 and 152, which are low-loss diodes such as Schottky diodes, may optionally be connected antiparallel to devices 142 and 143, as shown, in order to reduce switching losses by preventing turn-on of the parasitic reverse diode inherent in Si FETs. If low-voltage III-N E-mode HEMTs are used for devices 142 and 143, diodes 151 and 152 may be unnecessary, since switching losses in these devices tend to be small. Additionally, high temperature performance may be improved when low-voltage III-N E-mode HEMTs are used for devices 142 and 143. Diodes 151 and 152 have similar voltage-blocking capabilities to devices 142 and 143, i.e., when diodes 151 and 152 are reverse biased the diodes 151 and 152 are capable of blocking a voltage larger than the threshold voltage of devices 140 and 141, respectively, ideally about twice the threshold voltage of these devices.

The switch operates as follows. When node 146 is at a higher voltage than node 145, only device 140 is capable of blocking the voltage across the switch. In this case, when 0V is applied between source and gate of device 142, the voltage at node 154 is larger than a threshold voltage of the device $V_{th140}$, where $V_{th140} < 0$. The gate-source voltage of device 140 is therefore less than (more negative than) $V_{th140}$, so both devices 142 and 140 are OFF. Device 142 blocks a voltage slightly larger than $-V_{th140}$, and device 142 blocks the remainder of the voltage across the switch. When a positive control voltage greater than the threshold voltage of device 142 is applied between source and gate of device 142, the voltage at node 154 will be approximately the same as that at node 145, and therefore approximately the same as the voltage on the gate of device 140. In this case, both devices 142 and 140 are ON, and current flows through the switch. When node 145 is at a higher voltage than node 146, only device 141 is capable of blocking the voltage across the switch, and devices 141 and 143 perform the same functions described above for devices 140 and 142, respectively.

In some embodiments, a matrix converter, such as the one shown in FIG. 2, is formed where each of the nine bidirectional switches are III-N based switches, as described in FIGS. 4-11. This can provide one or more of the following advantages. Loss, including both DC and switching loss can be reduced. The circuit can have a very compact layout. The matrix converter can have fewer components than one composed of conventional devices. For example, a 9 switch matrix converter can have only one discrete part per switch for a 9 component solution (versus an 18 or 36 component solution, such as in the case of reverse blocking IGBTs or standard IGBTs, respectively). The gate-drive circuit can have reduced current and voltage requirements. This can enable an integrated on-chip gate drive or make the gate drive design more simple. The matrix converter can be designed at higher frequency, thus reducing the size of the line filter (L-C components). For example, the matrix converter can operate at >20 kHz or >40 kHz.

The III-N based HEMTs also provide a number of other advantages over conventional Si IGBTs. The power device figure of merit for DC loss and low switching loss is $(V_{BR}^2)/R_{on}$, where $V_{BR}$ is the device breakdown voltage and $R_{on}$ is the on-resistance. The wide bandgap of GaN, combined with the large sheet charge density and high mobility of 2DEGs in GaN HEMTs, results in devices with very high breakdown voltages and low on-resistances, and therefore low DC power loss. The lower input capacitance, higher cutoff frequency, and faster rise and fall times of GaN HEMTs lead to very low switching losses. GaN HEMT switching losses are much lower than those of Si IGBTs. For example, for a 1 kiloVolt device at 12 kHz, the switching loss of an IGBT is typically greater than 10 Watts, while for a GaN HEMT the switching loss is less than 2 Watts. GaN HEMT switching loss, as compared to IGBT switching loss, improves further as frequency increases. This can enable matrix converters operating at higher frequencies than what is possible with an IGBT based design. Because of the lower overall power loss that power circuits have when GaN HEMT technology is used, the circuits may use a smaller heat sink and/or simpler packaging, thus reducing size and cost. Compact matrix converters that could not be possible before may be enabled.

Additionally, III-N based HEMTs described herein are planar, allowing for very simple layouts. III-N based HEMTs have high transconductance, resulting in reduced gate-drive voltage requirements. The gate voltage for an IGBT swings from 0-15V, while for the III-N technology described here the swing need only be from 0-7 V or less. Thus, GaN HEMTs require less than 50% of the gate voltage swing of conventional IGBTs. As a result, it may be possible to use standard CMOS drive circuits directly instead of more expensive BiCMOS or bipolar drive circuits with 10-25V operating ranges. The large sheet charge density and high mobility of carriers in the channel of a GaN HEMT allows for high current densities and small gate capacitance or input capacitance. This allows for much more compact circuit design, as well as greatly reduced gate-drive current requirements. The III-N switch implementation has no diode, or more precisely no minority carrier junction, so the switching losses due to reverse recovery of the diode or pn junction of the reverse-blocking IGBT are eliminated.

Figure 12:
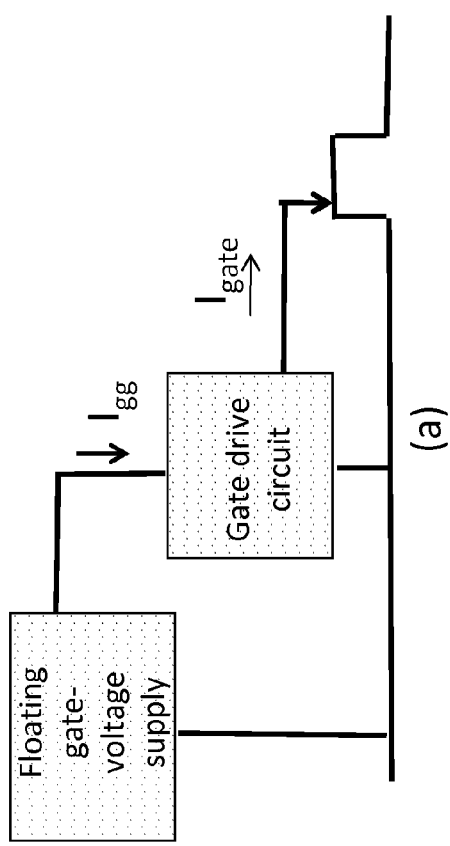
FIG. 12 is a chart of characteristics of a device described herein.

Referring to FIG. 12, a schematic diagram of the gate-drive circuit is illustrated for a single device. Average performance values for this device are compared with a range of values for a conventional IGBT. The gate voltage swing for a 20A HEMT is between 0 and less than 7 V. For a conventional 20A IGBT, the swing is 0-15 V. The gate-drive current IGG at a given frequency and duty cycle increases with increasing input capacitance. The input capacitance for the 20A HEMT is 15-30 pF/A, where for an IGBT it is 95 pF/A, which is 3-6 times lower input capacitance for GaN. The required gate-drive current ($I_{GG}$) average/peak for the 20A HEMT is <50-100 µA/210-420 mA, while for the IGBT is 2.5 mA/3 A. Thus the gate-drive current requirements are approximately 10× smaller for circuits composed of GaN HEMTs than for those composed of conventional IGBTs.

As mentioned, the gate drive circuit, which could include self protection circuits for the device, may thus be integrated with the power switch devices. It is also possible to implement this drive circuit based on an enhancement-depletion (E-D) type of logic where the E-D devices are GaN based. The E-mode device structure could be similar to the E-mode power device being used and the D-mode (normally on) may be implemented by simply not taking the steps that make a structure normally off. For example, referring to FIG. 5a, this can be as simple as not having the recess in the GaN layer 22 and not including the p type layer 21. Other similar arguments would apply to various different structures proposed to realize the E-mode device.

A number of embodiments of the invention have been described. Nevertheless, it will be understood that various modifications may be made without departing from the spirit and scope of the invention. Accordingly, other embodiments are within the scope of the following claims.

What is claimed is:

1. A bidirectional switch, comprising:
a first III-N based high electron mobility transistor; and
a second III-N based high electron mobility transistor, wherein the first III-N based high electron mobility transistor includes a first gate and a first drain and the second high electron mobility transistor includes a second gate and a second drain, wherein the first drain and the second drain are not in electrical contact with one another when the first gate and the second gate are biased relative to their respective source low or off and either a first source of the first III-N based high electron mobility transistor is in electrical contact with a second source of the second III-N based high electron mobility transistor or the first III-N based high electron mobility transistor shares a common source with the second III-N based high electron mobility transistor.

2. The bidirectional switch of claim 1, wherein the first III-N based high electron mobility transistor is adjacent to the second III-N based high electron mobility transistor on a common substrate.

3. The bidirectional switch of claim 2, wherein the first high electron mobility transistor and the second high electron mobility transistor share a common source located between the first gate and the second gate.

4. The bidirectional switch of claim 3, wherein the switch is configured so that when the first gate and the second gate are biased relative to the common source and below a threshold voltage of the first III-N based high electron mobility transistor, voltage is blocked by the first high electron mobility transistor and the switch is in an off state.

5. The bidirectional switch of claim 1, wherein when the first drain on the first high electron mobility transistor is biased higher than the second drain of the second high electron mobility transistor, only the first high electron mobility transistor is capable of being turned off.

6. The bidirectional switch of claim 1, wherein the switch is configured so that when the first drain of the first high electron mobility transistor is biased higher than the second drain of the second high electron mobility transistor and the first gate is biased relative to the first source of the first III-N based high electron mobility transistor or the common source and below a threshold voltage of the first III-N based high electron mobility transistor, voltage is blocked by the first high electron mobility transistor and the switch is in an off state.

7. The bidirectional switch of claim 1, wherein the switch is configured so that when the first drain of the first high electron mobility transistor is biased higher than the second drain of the second high electron mobility transistor and the first gate is biased relative to the first source of the first III-N based high electron mobility transistor or the common source and above a threshold voltage of the first III-N based high electron mobility transistor, both the first III-N based high electron mobility transistor and the second III-N based high electron mobility transistor allow current to pass through and the switch is in an on state.

8. The bidirectional switch of claim 1, wherein the switch is configured so that when the first drain of the first high electron mobility transistor is biased higher than the second drain of the second high electron mobility transistor and the first gate is biased relative to the first source of the first III-N based high electron mobility transistor or the common source and above a threshold voltage of the first III-N based high electron mobility transistor and the second gate is biased relative to the second source of the second III-N based high electron mobility transistor or the common source and above a threshold voltage of the second III-N based high electron mobility transistor, the switch is in an on state and the voltage drop across the second high electron mobility transistor is reduced in comparison to when the second gate is biased relative to the second source of the second III-N based high electron mobility transistor or the common source and below a threshold voltage of the second III-N based high electron mobility transistor.

9. The bidirectional switch of claim 1, wherein the first III-N based high electron mobility transistor is an enhancement mode device.

10. The bidirectional switch of claim 9, wherein the second III-N based high electron mobility transistor is an enhancement mode device.

11. The bidirectional switch of claim 9, wherein the first III-N based high electron mobility transistor is an N-polar enhancement mode device.

12. The bidirectional switch of claim 1, wherein the first III-N based high electron mobility transistor is a mirror image of the second III-N based high electron mobility transistor.

13. A bidirectional switch, comprising:
a first III-N based high electron mobility transistor; and
a second III-N based high electron mobility transistor, wherein the first III-N based high electron mobility transistor includes a first gate and a first source and the second high electron mobility transistor includes a second gate and a second source, wherein the first source and the second source are not in electrical contact with one another when the first gate and the second gate are biased relative to their respective source low or off and either the first drain of the first III-N based high electron mobility transistor is in electrical contact with the second drain of the second III-N based high electron mobility transistor or the first III-N based high electron mobility transistor shares a common drain with the second III-N based high electron mobility transistor.

14. The bidirectional switch of claim 13, wherein the first III-N based high electron mobility transistor is adjacent to the second III-N based high electron mobility transistor on a common substrate.

15. The bidirectional switch of claim 14, wherein the first high electron mobility transistor and the second high electron mobility transistor share a common drain located between the first gate and the second gate.

16. The bidirectional switch of claim 13, wherein when the first source of the first high electron mobility transistor is biased higher than the second source of the second high electron mobility transistor, only the second high electron mobility transistor is capable of being turned off.

17. The bidirectional switch of claim 13, wherein the switch is configured so that when the first source of the first high electron mobility transistor is biased higher than the second source of the second high electron mobility transistor and the second gate is biased relative to the second source and below a threshold voltage of the second III-N based high electron mobility transistor, voltage is blocked by the second high electron mobility transistor and the switch is in an off state.

18. The bidirectional switch of claim 13, wherein the switch is configured so that when the first source of the first high electron mobility transistor is biased higher than the second source of the second high electron mobility transistor and the second gate is biased relative to the second source and above a threshold voltage of the second III-N based high electron mobility transistor, both the first III-N based high electron mobility transistor and the second III-N based high electron mobility transistor allow current to pass through and the switch is in an on state.

19. The bidirectional switch of claim 18, wherein the switch is configured so that when the first source of the first high electron mobility transistor is biased higher than the second source of the second high electron mobility transistor and the second gate is biased relative to the second source and above a threshold voltage of the second III-N based high electron mobility transistor, and the first gate is biased relative to the first source and above a threshold voltage of the first III-N based high electron mobility transistor, the switch is in an on state and the voltage drop across the first high electron mobility transistor is reduced in comparison to when the first gate is biased relative to the first source and below a threshold voltage of the first III-N based high electron mobility transistor.

20. The bidirectional switch of claim 13, wherein the first III-N based high electron mobility transistor is an enhancement mode device.

21. The bidirectional switch of claim 20, wherein the second III-N based high electron mobility transistor is an enhancement mode device.

22. The bidirectional switch of claim 20, wherein the first III-N based high electron mobility transistor is an N-polar enhancement mode device.

23. The bidirectional switch of claim 13, wherein the first III-N based high electron mobility transistor is a mirror image of the second III-N based high electron mobility transistor.

24. A bidirectional switch, comprising:
a first III-N based high electron mobility transistor; and
a second III-N based high electron mobility transistor, wherein the first III-N based high electron mobility transistor shares a drift region with the second III-N based high electron mobility transistor and the switch is free of a drain contact in between the first III-N based high electron mobility transistor and the second III-N based high electron mobility transistor,
wherein a length of the drift region is equal to or greater than a sum of a maximum voltage difference between a first source terminal of the first III-N based high electron mobility transistor and the second source terminal of the second III-N based high electron mobility transistor and a difference between high and low voltage signals applied to the first gate with respect to the first source and the second gate with respect to the second, the sum divided by an effective critical field in material of the drift region.

25. The bidirectional switch of claim 24, further comprising a first field plate on a first gate of the first III-N based high electron mobility transistor and a second field plate on a second gate of the second III-N based high electron mobility transistor, wherein the first field plate extends towards the second gate and the second field plate extends towards the first gate.

26. A bidirectional switch, comprising:
a first enhancement mode transistor;
a second enhancement mode transistor;
a first depletion mode III-N high electron mobility transistor between the first enhancement mode transistor and the second enhancement mode transistor; and
a second depletion mode III-N high electron mobility transistor between the first depletion mode high electron mobility transistor and the second enhancement mode transistor;
wherein a gate of first depletion mode III-N high electron mobility transistor is electrically connected to a source of the first enhancement mode transistor, a gate of second depletion mode III-N high electron mobility transistor is electrically connected to source of second enhancement mode transistor, a source of first depletion mode III-N high electron mobility transistor is electrically connected to a drain of the first enhancement mode transistor, a source of the second depletion mode III-N high electron mobility transistor is electrically connected to drain of the second enhancement mode transistor, the source of the first depletion mode III-N high electron mobility transistor and the source of the second depletion mode III-N high electron mobility transistor are not in electrical contact with one another when the gates of the first depletion mode III-N high electron mobility transistor and second depletion mode III-N high electron mobility transistor are biased relative to their respective source low or off and either the first depletion mode III-N high electron mobility transistor shares a drain with the second depletion mode III-N high electron mobility transistor, a drain of the first depletion mode III-N high electron mobility transistor is electrically connected to a drain of the second depletion mode high electron mobility transistor, or the first depletion mode III-N high electron mobility transistor shares a drift region with the second depletion mode III-N high electron mobility transistor and the switch is free of a drain contact in between the first depletion mode III-N high electron mobility transistor, the second depletion mode III-N high electron mobility transistor and a length of the drift region is equal to or greater than a maximum voltage difference between a source terminal of the first enhancement mode III-N high electron mobility transistor and a source terminal of the second enhancement mode III-N high electron mobility transistor, divided by an effective critical field in material of the drift region.

27. The bidirectional switch of claim 26, wherein the first depletion mode III-N high electron mobility transistor and second depletion mode III-N high electron mobility transistor are on a common substrate.

28. The bidirectional switch of claim 27, wherein the first depletion mode III-N high electron mobility transistor shares a drain with the second depletion mode III-N high electron mobility transistor.

29. The bidirectional switch of claim 26, wherein a drain of the first depletion mode III-N high electron mobility transistor is electrically connected to a drain of the second depletion mode high electron mobility transistor.

30. The bidirectional switch of claim 26, wherein the first depletion mode III-N high electron mobility transistor shares a drift region with the second depletion mode III-N high electron mobility transistor and the switch is free of a drain contact in between the first depletion mode III-N high electron mobility transistor and the second depletion mode III-N high electron mobility transistor, and a length of the drift region is equal to or greater than a maximum voltage difference between a source terminal of the first enhancement mode III-N high electron mobility transistor and a source terminal of the second enhancement mode III-N high electron mobility transistor, divided by an effective critical field in material of the drift region.

31. The bidirectional switch of claim 26, wherein the first enhancement mode transistor is capable of blocking at least a threshold voltage of the first depletion mode III-N high electron mobility transistor.

32. The bidirectional switch of claim 26, wherein the first enhancement mode transistor is capable of blocking at least twice the threshold voltage of the first depletion mode III-N high electron mobility transistor.

33. A matrix converter, comprising nine of the bidirectional switches of claim 1.

34. A matrix converter, comprising nine of the bidirectional switches of claim 13.

35. A matrix converter, comprising nine of the bidirectional switches of claim 24.

36. A matrix converter, comprising nine of the bidirectional switches of claim 26.

* * * * *